(12) United States Patent
Azinger

(10) Patent No.: US 6,847,349 B2
(45) Date of Patent: Jan. 25, 2005

(54) SERIAL DATA CURSOR

(75) Inventor: Frederick A. Azinger, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 256 days.

(21) Appl. No.: 09/992,053

(22) Filed: Nov. 21, 2001

(65) Prior Publication Data

US 2003/0095099 A1 May 22, 2003

(51) Int. Cl.[7] .............................................. G09G 5/08
(52) U.S. Cl. ...................... 345/157; 345/162; 345/163; 345/167
(58) Field of Search ................................ 345/134, 145, 345/133, 135, 162, 163, 157, 168, 586, 5, 856; 348/601; 381/41–46; 340/709, 723; 358/143; 370/105, 514; 342/13; 707/501; 702/189; 307/517; 327/17

(56) References Cited

U.S. PATENT DOCUMENTS

| | | | | |
|---|---|---|---|---|
| 4,686,523 A | * | 8/1987 | Bristol ......................... 345/157 |
| 4,748,348 A | * | 5/1988 | Thong ........................... 327/17 |
| 4,786,967 A | * | 11/1988 | Smith et al. ................. 348/485 |
| 4,914,704 A | * | 4/1990 | Cole et al. .................. 704/235 |
| 4,991,581 A | | 2/1991 | Andries | |
| 5,196,837 A | * | 3/1993 | Shoji et al. ................. 345/856 |
| 5,214,784 A | | 5/1993 | Ward et al. | |
| 5,382,984 A | * | 1/1995 | Tsujihara et al. ............ 348/746 |
| 5,387,925 A | * | 2/1995 | Melling et al. ........... 345/440.1 |
| 5,448,571 A | * | 9/1995 | Hong et al. .................. 370/514 |
| 5,854,996 A | * | 12/1998 | Overhage et al. ........... 702/189 |
| 5,949,495 A | * | 9/1999 | Tallman et al. .............. 348/601 |
| 5,978,816 A | * | 11/1999 | Sakaguchi et al. ........ 715/501.1 |
| 6,107,989 A | | 8/2000 | Thompson | |
| 6,388,603 B1 | * | 5/2002 | Frazier et al. ................. 342/13 |

* cited by examiner

*Primary Examiner*—Vijay Shankar
*Assistant Examiner*—Prabodh M. Dharia
(74) *Attorney, Agent, or Firm*—Francis I. Gray; Thomas F. Lenihan

(57) ABSTRACT

A serial data cursor for extracting content from an analog waveform representing a serial digital data stream has a horizontal length equal to a "word-time" as determined by parameters of a protocol for the serial digital data stream and a clock recovered from the serial digital data stream. The serial data cursor delimits a portion of the analog waveform, which is then decoded into human readable form, such as binary, octal, hexadecimal, alpha-numeric or the like. A trigger may be generated from a specific parameter of the protocol, such as a frame start, so that the serial data cursor initially highlights a first data word of a frame of the serial digital data stream. Alternatively the decoded portion of the analog waveform may be compared to the specific parameter, and the serial data cursor incremented by a "bit-time" until the specific parameter is found in the serial digital data stream.

9 Claims, 3 Drawing Sheets

SERIAL DATA CURSOR

BACKGROUND OF THE INVENTION

The present invention relates to the analog waveform display of a serial digital data stream, and more particularly to a serial data cursor for providing content information about the serial digital data stream from the analog waveform display.

As the world moves more and more to serial busses, such as RS-232, Firewire, USB, etc., the need for people to observe and comprehend what is being transported over these busses is increasing. Logic analyzers are the traditional instrument for analyzing what digital data is being transported over parallel busses, but do not provide an analog waveform display of the data signal. Rather logic analyzers provide grouped data words. One type of cursor for interpreting displays of grouped data words is described in U.S. Pat. No. 6,107,989 issued Aug. 22, 2000. This patent describes an adaptive cursor that highlights on the binary display of grouped data words those bits that correspond to particular segments of a predefined protocol, i.e., when the cursor is placed at one bit position in the grouped data words, all bits that relate to the segment in which the cursor is located are highlighted and the corresponding name and value of the segment may be alpha-numerically displayed. However there is no comparable ability provided for analyzing analog waveforms of serial digital data streams.

Oscilloscopes do a fine job of capturing and displaying analog waveforms representing what is occurring at the physical layer, but do little to assist with the understanding of what information is being transported over digital data busses. Oscilloscopes now are incorporating hardware that triggers on specific serial analog patterns in a serial digital data stream, such as that disclosed in U.S. Pat. No. 5,214,784 issued May 25, 1993 entitled "Sequence of Events Detector for Serial Digital Data Which Selectively Outputs Match Signal in the Series Which Defines Detected Sequence." This hardware provides a way to continuously monitor serial digital data in analog form and precisely define the behavior that it must exhibit in order to qualify as the sequence of events that a user wants to detect. When a sequence in the serial digital data stream matches the user specified sequence, then a trigger is generated and the serial digital data stream is captured for processing/display as an analog waveform. However there is no information provided above the physical layer as to the information content of the serial digital data stream represented by such captured analog waveform.

What is desired is a serial data cursor that assists a user in understanding from an analog waveform display what information content is being represented by a corresponding serial digital data stream.

BRIEF SUMMARY OF THE INVENTION

Accordingly the current invention provides a serial data cursor to assist a user in understanding from an analog waveform for a serial digital data stream what information is being transported. The serial digital data stream is input to a trigger/acquisition module and a clock recovery module to capture data from the analog waveform and generate a recovered clock. The serial digital data stream may also be input to a protocol analysis module together with the recovered clock to convert the serial digital data into a binary data stream in order to identify a framing data word from the binary data stream and generate a trigger for the trigger/acquisition module as an alternative trigger source. In any event the recovered clock is input to a cursor generator together with a word size parameter for the protocol represented by the serial digital data stream to generate the serial data cursor. The captured analog waveform and the serial data cursor are processed by a display processor for presentation on an appropriate display device, and the captured analog waveform and recovered clock are input to the protocol analysis module to decode the data word indicated by the serial data cursor. The serial data cursor may be represented by a highlighted box or a linear bar laid over, under or above the displayed analog waveform, and has a horizontal length in time equal to one "word-time" determined by the protocol and the recovered clock for the serial digital data stream.

The objects, advantages and other novel features of the present invention are apparent from the following detailed description when read in conjunction with the appended claims and attached drawing.

DETAILED DESCRIPTION OF THE INVENTION

Figure 1:
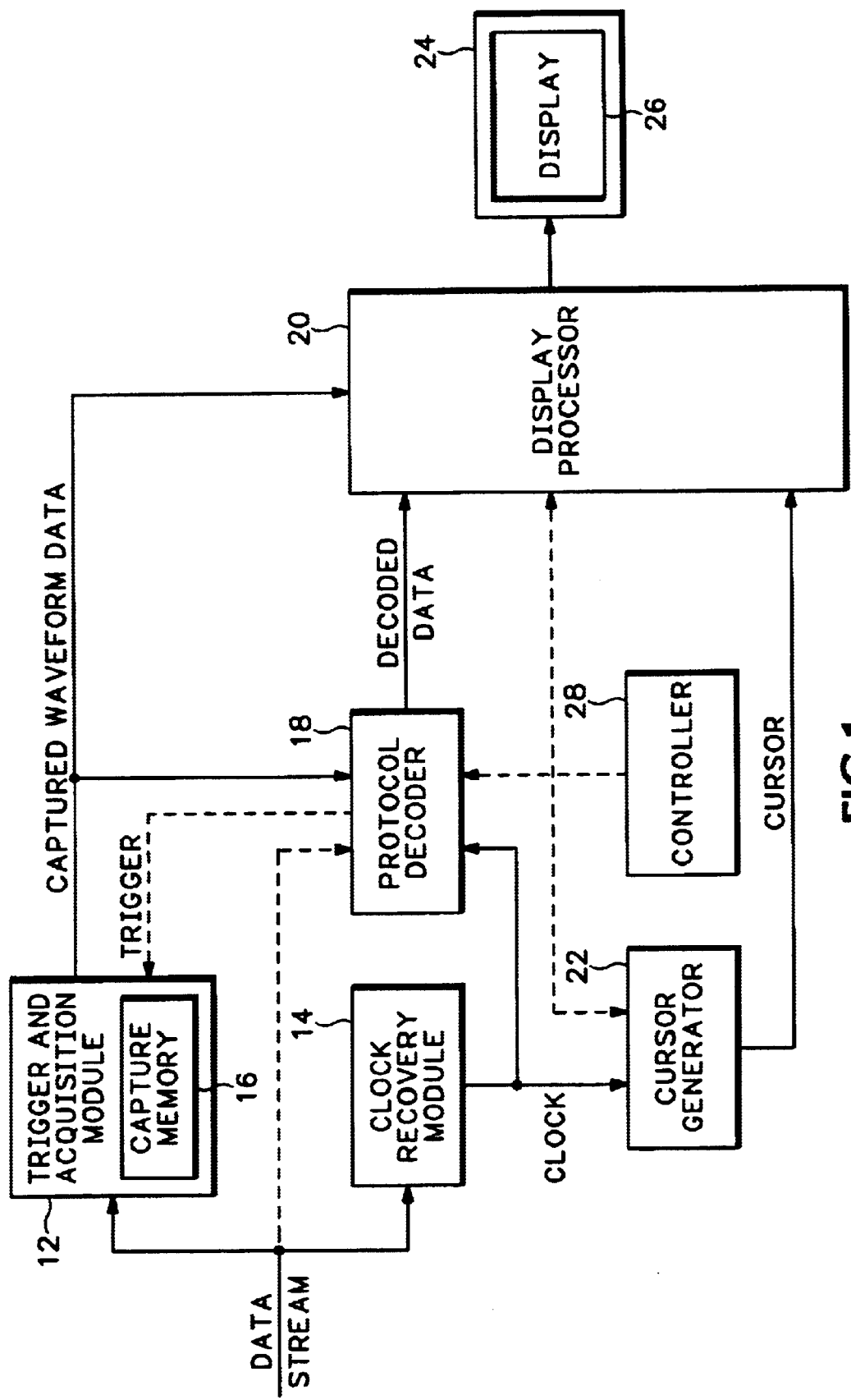
FIG. 1 is a block diagram view of a device using a serial data cursor according to the present invention.

Referring now to FIG. 1 a serial digital data stream is input to a trigger/acquisition module 12 which includes a capture memory 16 and to a clock recovery module 14 that provides a recovered clock. The serial digital data stream may also be input to a protocol analysis module 18 together with the recovered clock. Output from the trigger/acquisition module 12 is the captured analog waveform data which is provided to the protocol analysis module 18 and to a display processor 20. The protocol analysis module 18 also provides decoded data in human readable form, such as binary, hexadecimal, alpha-numeric, etc., to the display processor 20. The recovered clock is input to a cursor generator 22 that provides a serial data cursor to the display processor 20. The display processor 20 provides the combination of the captured analog waveform data, the decoded data and the serial data cursor to a display device 24 having a display screen 26. A controller 28 provides protocol parameters to the protocol analysis module 18 and the cursor generator 22 as well as serial data cursor position relative to the captured analog waveform data.

Figure 2:
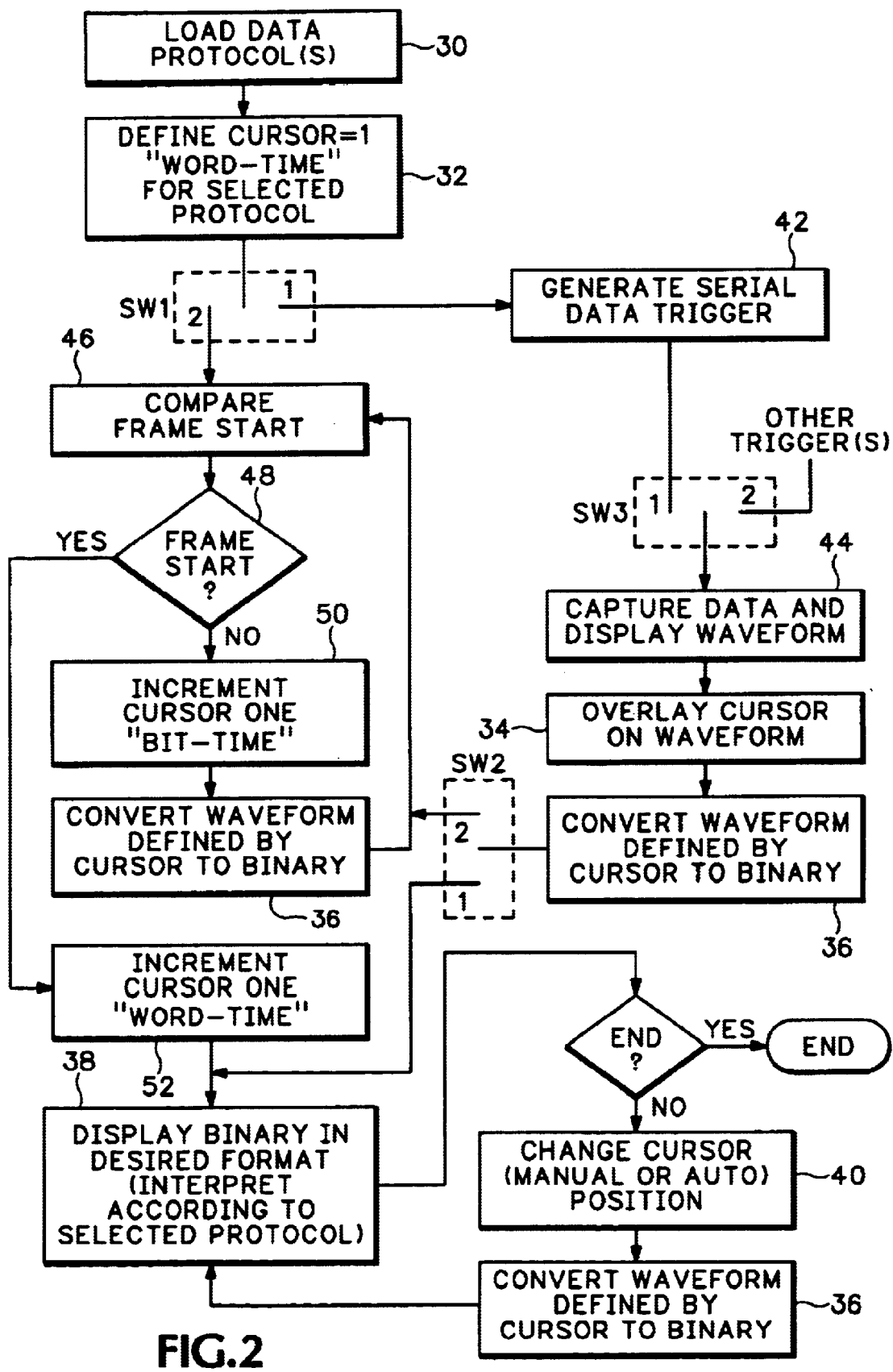
FIG. 2 is a flow diagram view illustrating the use of a serial data cursor according to the present invention.

As shown in FIG. 2 a method of providing information about the content of the serial data stream from the captured analog waveform data display is shown which includes loading (30) into the protocol analysis module 18 by the controller 28 a protocol that has parameters which describe the serial data stream being observed, such as the encoding, number of bits, framing, data rate, word size, etc. The cursor generator 22 from the recovered clock and the word size then creates (32) as the serial data cursor a representation for the display, such as a box or linear bar, whose horizontal length in time is proportional to one "word-time" in the serial data stream. For example, for eight-bit words where the bit period from the recovered clock is 100 nanoseconds, the serial data cursor representation has a length of 800 nanoseconds. The serial data cursor may be displayed (34) to encompass, underline, overline, etc. the captured analog waveform data being displayed on the display screen 26, and the portion of the displayed analog waveform data delimited by the serial data cursor is decoded (36) by the protocol analysis module 18 with the resulting bit pattern being displayed (38) in a form that is friendly to the user, such as binary, hexadecimal, ASCII (American Standard Code for Information Interchange), etc., and interpreted according to the protocol. As the user changes (40) the serial data cursor position, the serial data cursor traverses the displayed analog waveform data and the decoded information at each position is displayed. Using a trigger (42) based on a serial data pattern representing a framing word according to the applicable protocol, derived either from the protocol analysis module 18 from the serial digital data stream and recovered clock or as an analog pattern according to U.S. Pat. No. 5,214,784 referenced above, the process follows path 1 through the switches SW1, SW2 and SW3 so that the serial digital data stream may be captured (44) in the capture memory 16 starting with the first "word-time" for a frame of the serial digital data stream. The serial data cursor is initially located at the first "word-time" and, as the serial data cursor is moved, it moves correspondingly in either one "word-time" or "bit-time" increments and the corresponding decoded data from the protocol analysis module 18 for the portion of the displayed analog waveform data delimited by the cursor is displayed.

Alternatively where other types of triggers are used, the path indicated by the numeral 2 in the switches SW1, SW2 and SW3 is followed. The serial digital data stream is captured and displayed (44) in response to a regular trigger, such as edge (rising or falling) for example, and the serial data cursor is overlaid (34) and the corresponding captured analog waveform data is converted (36) to binary by the protocol analysis module 18. The binary is compared (46) with a frame start pattern by the protocol analysis module 18 according to the protocol. If the frame start is not detected (48), the serial data cursor may be moved (50) bit-time by bit-time along the displayed analog waveform data until a known information content is recognized, either manually or automatically, such as the start of the frame for the serial digital data stream. Then the serial data cursor may be moved (52) one "word-time" to get to the start of the data after the frame start. The serial data cursor then may be moved (40) in "word-time" or "bit-time" increments to interpret the information content of the serial digital data stream as described above.

Figure 3:
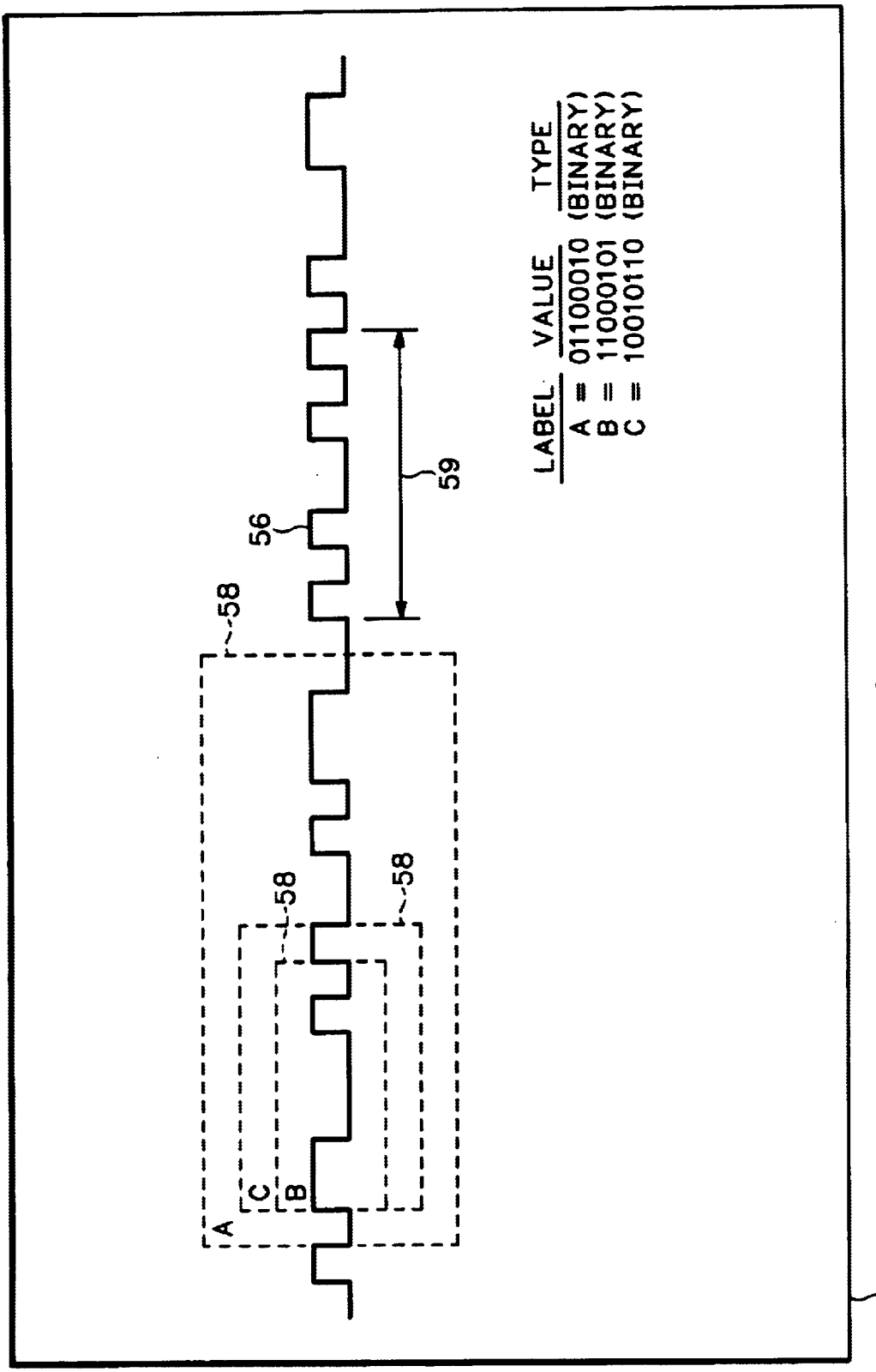
FIG. 3 is a plan view of a display screen illustrating a serial data cursor with an analog waveform display according to the present invention.

As shown on FIG. 3 the display screen 26 has an analog waveform 56 of the serial data stream which is a series of sample points upon which the serial data cursor, in this case a highlighted area in the form of a box 58, is overlaid to encompass a portion of the displayed analog waveform data corresponding to one data word according to the protocol. An alternative form for the serial data cursor may be in the form of a linear bar 59 either below (as shown) or above the displayed analog waveform data 56. The box 58 at position A has a decoded binary value as displayed, which could be displayed as an octal, hexadecimal or alpha-numeric value as desired with a content label (not shown) according to the protocol. The box 58 may be incremented by one "bit-time" to position B, or by one "word-time" to position C, with the resulting decoded result shown in binary, for this illustration, on the display screen 26. The decoding of the serial digital data stream into a binary representation may be accomplished by the protocol analysis module 18 using well-known techniques.

Thus the present invention provides a serial data cursor for use on a waveform instrument that has a length equal to one "word-time" of a serial digital data stream according to a specified protocol, the analog waveform delimited by the serial data cursor being decoded to provide content information from the serial data stream in human readable form.

What is claimed is:

1. A serial data cursor for an analog waveform display of a serial digital data stream comprising:
   a cursor representation having a horizontal length equal to a "word-time" for the serial digital data stream derived from a specified protocol and a clock recovered from the serial digital data stream; and
   means for decoding a portion of the analog waveform display delimited by the cursor representation to present a human readable content display.

2. The serial data cursor as recited in claim 1 wherein the cursor representation comprises a highlighted box that encompasses the "word-time" of the analog waveform display.

3. The serial data cursor as recited in claim 1 wherein the cursor representation comprises a linear bar that extends along the analog waveform display for the "word-time".

4. A serial data cursor for extracting content from a serial digital data stream comprising:
   means for displaying an analog waveform of the serial digital data stream;
   means for displaying a representation of the serial data cursor along with the analog waveform, the representation having a horizontal length equal to a "word-time" for the serial digital data stream derived from a specified protocol and a clock recovered from the serial digital data stream; and
   means for decoding a portion of the analog waveform delimited by the representation to provide a display of the content in human readable form.

5. The serial data cursor as recited in claim 4 wherein the representation comprises a highlighted box that encompasses the "word-time" of the displayed analog waveform.

6. The serial data cursor as recited in claim 4 wherein the representation comprises a linear bar that extends along the displayed analog waveform for the "word-time".

7. A method of using a serial data cursor for extracting content from the analog waveform of a serial digital data stream comprising the steps of:
   loading a data protocol having parameters for the serial digital data stream;
   determining a "word-time" from the parameters and a clock recovered from the serial digital data stream;
   displaying the analog waveform together with a representation of the serial data cursor having a length equal to the "word-time"; and
   decoding a portion of the analog waveform delimited by the serial data cursor to provide the content in human readable form.

8. The method as recited in claim 7 further comprising the steps of:
   generating a trigger according to a specified characteristic of the serial digital data stream from the parameters; and
   capturing the analog waveform according to the trigger.

9. The method as recited in claim 7 further comprising the steps of:
   comparing the portion with a specified parameter from among the parameters; and
   incrementing the serial data cursor by "bit-time" increments until the portion equals the specified parameter.

* * * * *